United States Patent
Suter et al.

(10) Patent No.: US 6,811,074 B2
(45) Date of Patent: Nov. 2, 2004

(54) METHOD AND APPARATUS FOR DISPENSING SOLDER ON A SUBSTRATE

(75) Inventors: Guido Suter, Steinhausen (CH); Christoph Tschudin, Wettswil (CH)

(73) Assignee: ESEC Trading SA, Cham (CH)

( * ) Notice: Subject to any disclaimer, the term of this patent is extended or adjusted under 35 U.S.C. 154(b) by 39 days.

(21) Appl. No.: 10/377,204

(22) Filed: Feb. 27, 2003

(65) Prior Publication Data
US 2003/0168498 A1 Sep. 11, 2003

(30) Foreign Application Priority Data
Mar. 8, 2002  (CH) ..................................... 2002 0411/02

(51) Int. Cl.⁷ ............................................. B23K 31/02
(52) U.S. Cl. ..................... 228/261; 228/33; 222/593
(58) Field of Search ............................ 228/245–262, 228/33–42; 427/96; 118/323; 222/590, 593, 603

(56) References Cited

U.S. PATENT DOCUMENTS

| | | | |
|---|---|---|---|
| 4,411,379 A | * 10/1983 | Gravel | 228/52 |
| 4,577,398 A | 3/1986 | Sliwa et al. | 29/590 |
| 4,709,849 A | 12/1987 | Socolowski | 228/246 |
| 4,934,309 A | 6/1990 | Ledermann et al. | 118/50 |
| 5,421,504 A | * 6/1995 | Spirig | 228/41 |
| 5,878,939 A | 3/1999 | Luchinger et al. | 228/33 |
| 6,056,184 A | 5/2000 | Luchinger et al. | 228/33 |
| 2002/0084307 A1 | * 7/2002 | Ruszowski | 228/51 |
| 2003/0168498 A1 | * 9/2003 | Suter et al. | 228/256 |

FOREIGN PATENT DOCUMENTS

| | | | |
|---|---|---|---|
| DE | 37 34 550 | 10/1987 | B23K/3/02 |
| DE | 39 13 143 | 4/1989 | B23K/3/04 |
| EP | 0752294 A2 * | 1/1997 | |
| EP | 0970774 A2 * | 1/2000 | |
| EP | 001342525 A1 * | 9/2003 | |
| EP | 1393845 A2 * | 3/2004 | |
| JP | 232746 | 9/1997 | H05K/3/34 |
| JP | 252762 | 9/2001 | B23K/3/02 |
| JP | 02004025301 A * | 1/2004 | |

* cited by examiner

*Primary Examiner*—Kiley Stoner
(74) *Attorney, Agent, or Firm*—Thelen Reid & Priest LLP; David B. Ritchie

(57) ABSTRACT

For dispensing solder on a substrate, a soldering wire and a forming gas heated to a predetermined temperature are fed to a mixing chamber of a two-component nozzle so that, in the mixing chamber, solder is melted off and carried with the gas stream. The solder blown out of the two-component nozzle settles on the substrate. The two-component nozzle is moved or swivelled relative to the substrate in order to distribute the solder over a predetermined area of the substrate.

5 Claims, 1 Drawing Sheet

Figure 1:
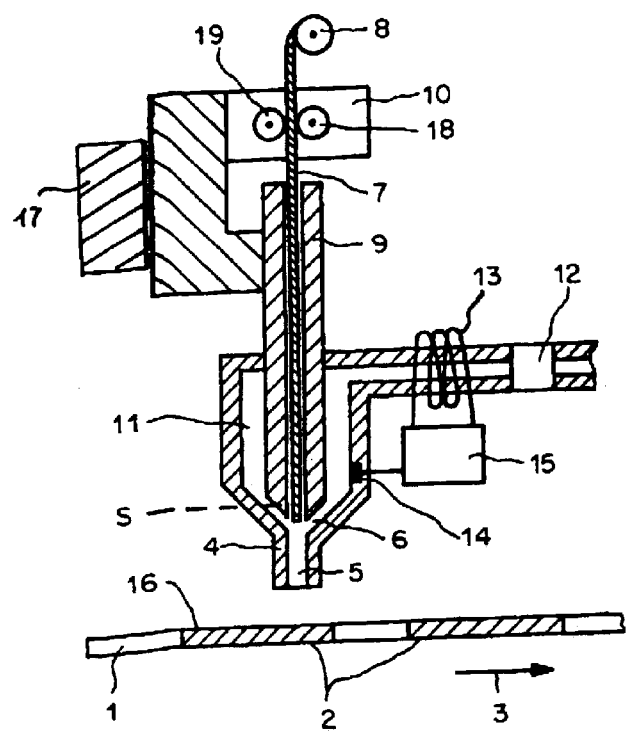

METHOD AND APPARATUS FOR DISPENSING SOLDER ON A SUBSTRATE

PRIORITY CLAIM

The present application claims priority under 35 U.S.C § 119 based upon Swiss Patent Application No. 2002 0411/02 filed on Mar. 8, 2002.

FIELD OF THE INVENTION

The invention concerns a method and an apparatus for dispensing solder on a substrate.

BACKGROUND OF THE INVENTION

Soldering methods of this type are used typically— however not exclusively—for the mounting of semiconductor chips onto a metallic substrate, a so-called leadframe. As a rule, power semiconductors are mainly connected to the substrate, which normally comprises copper, by means of soft soldering in order to guarantee a more effective dissipation of the heat loss created during production via the solder connections as compared to mounting by means of adhesive. However, above all with increased power density, high demands are placed on the homogeneity of the solder connections, ie, defined density, uniform spread and perfect wetting of the solder layer over the entire chip surface and complete freedom from bubbles as well as purity of the soldered connection are demanded; on the other hand, the solder must not exude laterally out of the soldered joint and spread out next to the chip which again necessitates the exact dosing and positioning of the solder portion.

In the application area of chip assembly, a method is widely used in practice with which the end of the soldering wire is brought into contact with the substrate which is heated to above the melting temperature of the solder in order to melt off a piece of the wire. Because of its simplicity and flexibility, this method is well suited for mass production. However, the melting process, above all the volume and the positioning of the solder portion, is very dependent on the material combination and the surface characteristics of the substrate, ie, the amount and position of the respective solder to be melted are subject to considerable variations. Furthermore, the roughly circular shaped wetted area created is badly adapted to the rectangular or square form of the chips. In addition, a forming stamp is known from U.S. Pat. No. 6,056,184 with which the solder portion deposited on the substrate can be brought into a flat, rectangular form adapted to the shape of the chips.

A method with which liquid solder is injected into a cavity formed between the forming stamp and the substrate is known from U.S. Pat. No. 5,878,939.

These known methods have several disadvantages. The shape of the deposited solder is either round or a specific forming stamp must be manufactured for each rectangular shape. Such a forming stamp has side walls which occupy a part of the substrate. Therefore, the solder can not be applied up to the edge of the chip island which is to accept the chip. Furthermore, the substrate must be heated to above the melting temperature of the solder and the deposited solder must be kept in liquid form from its application up to depositing the semiconductor chip. It is also of disadvantage that the parts which come into contact with the liquid solder have to be regularly cleaned for which purpose production has to be interrupted.

A method with which flat formed bodies made of soldering metal, so-called "solder preforms", are prefabricated, the dimensions of which are adapted to the chips is known from U.S. Pat. No. 4,577,398 and U.S. Pat. No. 4,709,849. The solder preforms are then placed onto the substrate and melted by it in order to form a soldering layer of the required dimensions. However, because of the necessary prefabrication of the solder preforms and the additional assembly operations, this method is very costly and not very flexible.

BRIEF DESCRIPTION OF THE INVENTION

The object of the invention is to develop a method for applying solder to a substrate which no longer demonstrates the named disadvantages.

The method in accordance with the invention for dispensing solder on a substrate distinguishes itself in that a soldering wire and a forming gas heated to a predefined temperature are supplied to a mixing chamber of a two-component nozzle so that, in the mixing chamber, solder is melted off and carried with the gas stream. The solder blown out of the two-component nozzle settles on the substrate. The two-component nozzle is moved or swivelled relative to the substrate in order to deposit the blown out solder onto the predetermined area of the chip island. The soldering wire is preferably fed to the mixing chamber in a cooled guide pipe. To interrupt the melting of the solder, it is preferred to pull back the soldering wire so that the end of the soldering wire is located within the guide pipe.

The invention enables the contactless application of solder onto a substrate so that no scratches can occur on the substrate. In addition, the pattern of the deposited solder can be freely programmed and solder can be applied up to the edge of the chip island. The solder can be deposited without the substrate having to be heated up to the melting temperature of the solder. The distribution of the deposited solder on the substrate can therefore be controlled by a camera without heat-related waviness blurring or distorting the picture.

The accompanying drawings, which are incorporated into and constitute a part of this specification, illustrate one or more embodiments of the present invention and, together with the detailed description, serve to explain the principles and implementations of the invention. The figures are not to scale.

BRIEF DESCRIPTION OF THE DRAWING FIGURES

Figure 2:
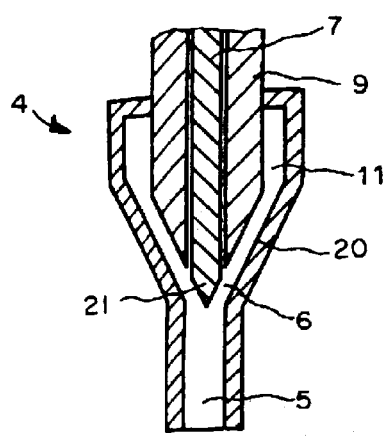
Figure 3:
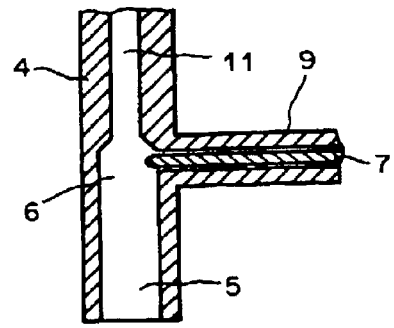

In the drawings:

FIG. 1 shows a device for dispensing solder on a substrate with a two-component nozzle, FIG. 2 shows a first embodiment of the two-component nozzle, and FIG. 3 shows a second embodiment of the two-component nozzle.

DETAILED DESCRIPTION OF THE INVENTION

FIG. 1 shows a device for dispensing solder on a substrate 1. The substrate 1 is, for example, a metallic, strip-shaped substrate, a so-called leadframe, with several chip islands 2 for accepting semiconductor chips, or a single-position substrate for accepting one single semiconductor chip. The substrate 1 is transported step-by-step in the direction of the arrow 3. The device comprises a two-component nozzle 4 with an outlet channel 5 and a mixing chamber 6 to which solder in the form of a soldering wire 7 on the one hand and, on the other hand, forming gas heated to a predefined temperature are supplied. The mixing chamber 6 can also simply be the initial part of the outlet channel 5. It marks the area in which the hot forming gas melts off solder from the soldering wire 7. The forming gas is preferably nitrogen $N_2$ enriched with hydrogen $H_2$. The hydrogen portion amounts to only a few percent and serves to reduce any oxygen $O_2$ which may be present. The soldering wire 7 wound onto a spool 8 is fed through a guide pipe 9 to the mixing chamber 6 of the two-component nozzle 4 and is fed forward by means of a drive 10. The forming gas is fed to the mixing chamber 6 via a gas channel 11. The gas channel 11 contains a valve 12 to control the flow and a heater 13 to heat up the forming gas to a predefined temperature. The temperature of the forming gas is measured by means of a temperature sensor 14 mounted in the gas channel 1 before the mixing chamber 6. The temperature sensor 14, the heater 13 and an electronic circuit 15 form, in a known way, a control loop for controlling the temperature of the forming gas. When the forming gas flowing out of the outlet channel 5 of the two-component nozzle 4 impacts on the substrate 1, then the solder carried with the forming gas settles on the substrate 1.

The dimensions of the outlet of the two-component nozzle 4 are normally smaller than those which the area 16 of the solder portion deposited on the substrate 1 should have. During application of the solder onto the substrate 1, the gas stream flowing out of the two-component nozzle 4 must therefore be guided back and forth in a writing movement over the intended area 16. The device therefore has a drive mechanism 17 in order to move the two-component nozzle 4 either in two different directions parallel to the surface of the substrate 1 or to swivel it on two predetermined axes parallel to the surface of the substrate 1.

It must be possible to switch on the supply of solder for depositing a solder portion onto the substrate 1 and to interrupt it for the forward feeding of the substrate 1 to the next chip island 2. In order to deposit solder, the soldering wire 7 is therefore fed forward at a predetermined speed by means of the drive 10. The forming gas flowing past the soldering wire 7 in the mixing chamber 6 continually melts off solder and deposits it onto the substrate 1. In order to stop the melting of solder in the mixing chamber 6, the forward feed of the soldering wire 7 is stopped. Preferably, the soldering wire 7 is even pulled back by a predetermined distance D by means of the drive 10. It is not necessary to interrupt the supply of forming gas.

The drive 10 for the forward feed of the soldering wire 7 preferably comprises a stepper motor which drives a drive wheel 18 and a pressure wheel 19 which presses the soldering wire 7 against the drive wheel 18. The pressure wheel 19 has an encoder via which the forward feed as well as the backward movement of the soldering wire 7 is controlled.

The amount of solder to be deposited onto the substrate 1 and the area 16 to be occupied by the solder are process-determined, given quantities. As a rule, the time $\tau$ which is available in order to deposit the solder portion is also given. The time $\tau$ amounts typically to several hundred milliseconds, eg, 300 milliseconds. Firstly, some process relevant parameters are determined in a preparation step:

1. The necessary wire length L of the soldering wire 7 is calculated from the amount $M_L$ of solder to be deposited and the cross-sectional area A of the soldering wire 7 as:

$L=M_L/A.$

2. The forward feed speed v of the soldering wire is calculated from the length L and the time available $\tau$ as:

$v=L/\tau.$

3. The necessary deposit rate r of the solder is calculated from the amount of solder to be deposited $M_L$ and the time available $\tau$ as:

$r=M_L/\tau.$

4. The deposit rate r is a function of the temperature T and the flow rate $\Phi$ of the forming gas:
    $r=f(T, \Phi)$. A temperature $T_P$ and a flow rate $\Phi_P$ are now determined which fulfill the condition $M_L/\tau=f(T_P, \Phi_P).$ The temperature $T_P$ of the forming gas must be above the melting temperature of the solder. Typically, it lies within the range of 400° C. to 600° C. The flow rate $\Phi_P$ should also exceed a predetermined minimum value.

Preferably, the guide pipe 9 is cooled to a predetermined temperature. In this way, the stability of the process is improved as the melting of the soldering wire 7 takes place under controlled conditions.

At the start of production operation, the valve 12 is opened and set so that the flow rate of the forming gas achieves the value $\Phi_P$. The temperature of the forming gas is regulated to the value $T_P$. The tip of the soldering wire 7 is located at a predetermined location S within the guide pipe 9. The two-component nozzle 4 is located at an initial position. After the first chip island 2 has been presented for application of the solder, the solder is applied in accordance with the following process:

1. The soldering wire 7 is fed forward by a predetermined distance D. The tip of the soldering wire 7 is now located in the mixing chamber 6 so that the forming gas flowing by melts solder and carries it with it.
2. During the time $\tau$ the soldering wire 7 is continuously fed forward at the speed v. The gas stream flowing out of the two-component nozzle 4 is guided over the substrate 1 by means of the drive mechanism 17 whereby it leaves behind a continuous line of deposited solder on the substrate 1. The line is, for example, wave-shaped. The writing movement of the two-component nozzle 4 by means of the drive mechanism 17 is synchronised with the start of the forward feed of the soldering wire 7 and controlled so that the given line is written within the available time.
3. After the time $\tau$ has expired, the soldering wire 7 is pulled back by the predetermined distance D.

The application of the solder is now concluded. The two-component nozzle 4 is brought into its initial position and the next chip island is presented.

The flow rate $\Phi_P$ of the forming gas is preferably kept constant for the processing of different products, for example at 200 litres per hour, and, in preparation step 4, the temperature T of the forming gas is adapted to the respective necessary deposit rate r.

In the following, two different examples for the design of the two-component nozzle 4 are explained in more detail:

EXAMPLE 1

FIG. 2 shows a two-component nozzle 4 with which the guide pipe 9 and the outlet channel 5 run coaxially, for example, in vertical direction as shown. The gas channel 11 runs coaxially to the guide pipe 9 and, at the end of the guide pipe 9, opens out into the outlet channel 5 on all sides at an inlet angle φ defined by a wall 20 of the gas channel 11. With this example, the mixing chamber 6 is part of the outlet channel 5. It is defined by the upper area of the outlet channel 5 where the forming gas and the melted solder mix together. The inlet angle φ fundamentally influences the geometrical shape of the end of the soldering wire 7. When the inlet angle φ amounts to more than around 60°, then the end of the soldering wire 7 is spherical. When the inlet angle φ, as presented, amounts to less than around 60°, then the end of the soldering wire 7 is conical. The length of the cone 21 is dependent on the angle φ. When the length of the cone 21 exceeds a certain amount, then it happens from time to time that a part of the cone 21 tears off uncontrollably. The cross-section of the gas channel 11 determines the speed of the forming gas on flowing into the outlet channel 5. The smaller the cross-section at predetermined flow rate $\Phi_P$, the greater the inlet speed.

EXAMPLE 2

With this example presented in FIG. 3, the gas channel 11 and the outlet channel 5 are coaxial. The guide pipe 9 for the soldering wire 7 runs horizontally so that the soldering wire 7 protrudes laterally into the outlet channel 5. The cross-sectional area of the gas channel 11 is smaller than the cross-sectional area of the outlet channel 5: With the transition from gas channel 11 to outlet channel 5, the cross-section of the two-component nozzle widens and that immediately above the location where the guide pipe 9 leads into the outlet channel 5. With this example, the mixing chamber 6 is also part of the outlet channel 5.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A method for dispensing solder on a substrate, wherein a soldering wire and a forming gas heated to a predetermined temperature are supplied to a mixing chamber of a two-component nozzle so that in the mixing chamber solder is melted off and carried with a gas stream, and wherein the two-component nozzle is moved or swivelled relative to the substrate, whereby the solder blown out of the two-component nozzle settles on the substrate.

2. The method according to claim 1, wherein the soldering wire is fed to the mixing chamber in a guide pipe and wherein, in order to interrupt the depositing of solder, the soldering wire is pulled back so that an end of the soldering wire is located within the guide pipe.

3. The method according to claim 1, wherein a guide pipe is cooled to a predetermined temperature.

4. The method according to claim 2, wherein the guide pipe is cooled to a predetermined temperature.

5. An apparatus for dispensing solder on a substrate, comprising:

a two-component nozzle with a mixing chamber, a guide pipe for supplying a soldering wire to the mixing chamber, a gas channel for supplying a forming gas to the mixing chamber, the gas channel comprising a valve for controlling the flow rate of the forming gas and a heater for heating the forming gas to a predetermined temperature, and a drive mechanism for moving or swiveling the two-component nozzle relative to the substrate.

\* \* \* \* \*